(12) United States Patent
Oshio

(10) Patent No.: US 7,283,021 B2
(45) Date of Patent: Oct. 16, 2007

(54) FREQUENCY ADJUSTMENT METHOD OF SURFACE ACOUSTIC WAVE DEVICE, SURFACE ACOUSTIC WAVE DEVICE, AND ELECTRONIC DEVICE

(75) Inventor: Masahiro Oshio, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 117 days.

(21) Appl. No.: 11/142,472

(22) Filed: Jun. 2, 2005

(65) Prior Publication Data

US 2005/0275487 A1    Dec. 15, 2005

(30) Foreign Application Priority Data

Jun. 9, 2004   (JP)   ............... 2004-171164
Feb. 8, 2005   (JP)   ............... 2005-031525

(51) Int. Cl.
H03H 9/00 (2006.01)
H03H 9/25 (2006.01)
(52) U.S. Cl. .......................... 333/195; 333/193
(58) Field of Classification Search .......... 333/193, 333/194, 195, 196; 310/313 R
See application file for complete search history.

(56) References Cited

U.S. PATENT DOCUMENTS

| | | | | |
|---|---|---|---|---|
| 6,310,425 | B1 * | 10/2001 | Tanaka | ............ 310/313 R |
| 6,972,642 | B2 * | 12/2005 | Oshio | ............ 333/193 |
| 2004/0164645 | A1 | 8/2004 | Oshio | |
| 2004/0164821 | A1 | 8/2004 | Oshio | |

FOREIGN PATENT DOCUMENTS

JP    A 61-92011     5/1986
JP    A 62-274081    11/1987

OTHER PUBLICATIONS

De Zhang et al.; "Study of Propagation Properties of Quasi-longitudinal Leaky Surface Acoustic Wave Propagating on Y-Rotated Cut Quartz Substrates"; IEEE Ultrasonics Symposium, 1999; pp. 321-324.

Ivan D. Avramov; "High Performance GHz Range Surface Transverse Wave Resonant Devices, Application to Low-Noise Microwave Oscillators and Communication Systems"; International Meeting on Future Trends of Acoustic Wave Devices, 1996; pp. 132-139.

Yook-Kong Yong et al.; "Analysis of High Velocity Pseudo-Surface Acoustic Waves (HVPSAW) in Quartz Periodic Structures with Electrode Fingers"; IEEE/EIA International Frequency Control Symposium and Exhibition; 2000; pp. 301-306.

* cited by examiner

*Primary Examiner*—Dean Takaoka
(74) *Attorney, Agent, or Firm*—Oliff & Berridge, PLC

(57) ABSTRACT

A method for adjusting frequency of a surface acoustic wave device includes performing a frequency adjustment. The surface acoustic wave device includes a substrate including at least one of a lithium tantalate substrate, a lithium niobate substrate, and a lithium tetraborate substrate. The surface acoustic wave device further includes an IDT electrode formed on the substrate that excites a pseudo-longitudinal leaky surface acoustic wave. The performing includes frequency adjustment by adjusting a thickness of the substrate at a side opposite in a thickness direction to a side on which the IDT electrode is formed.

7 Claims, 10 Drawing Sheets

F I G. 1
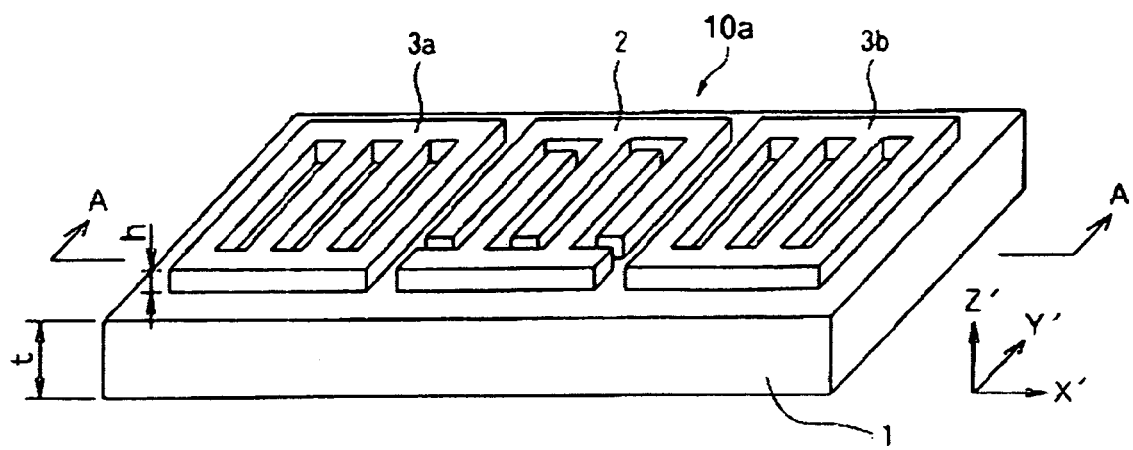
(a)
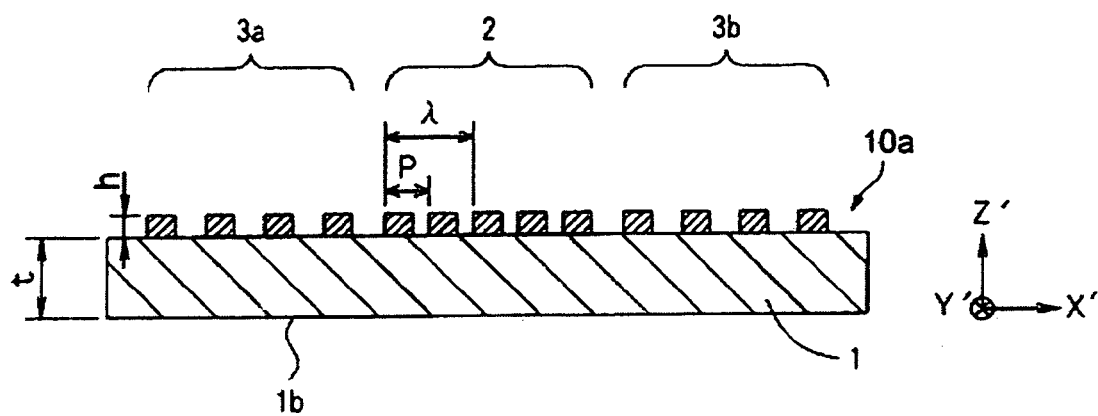
(b)

F I G. 4
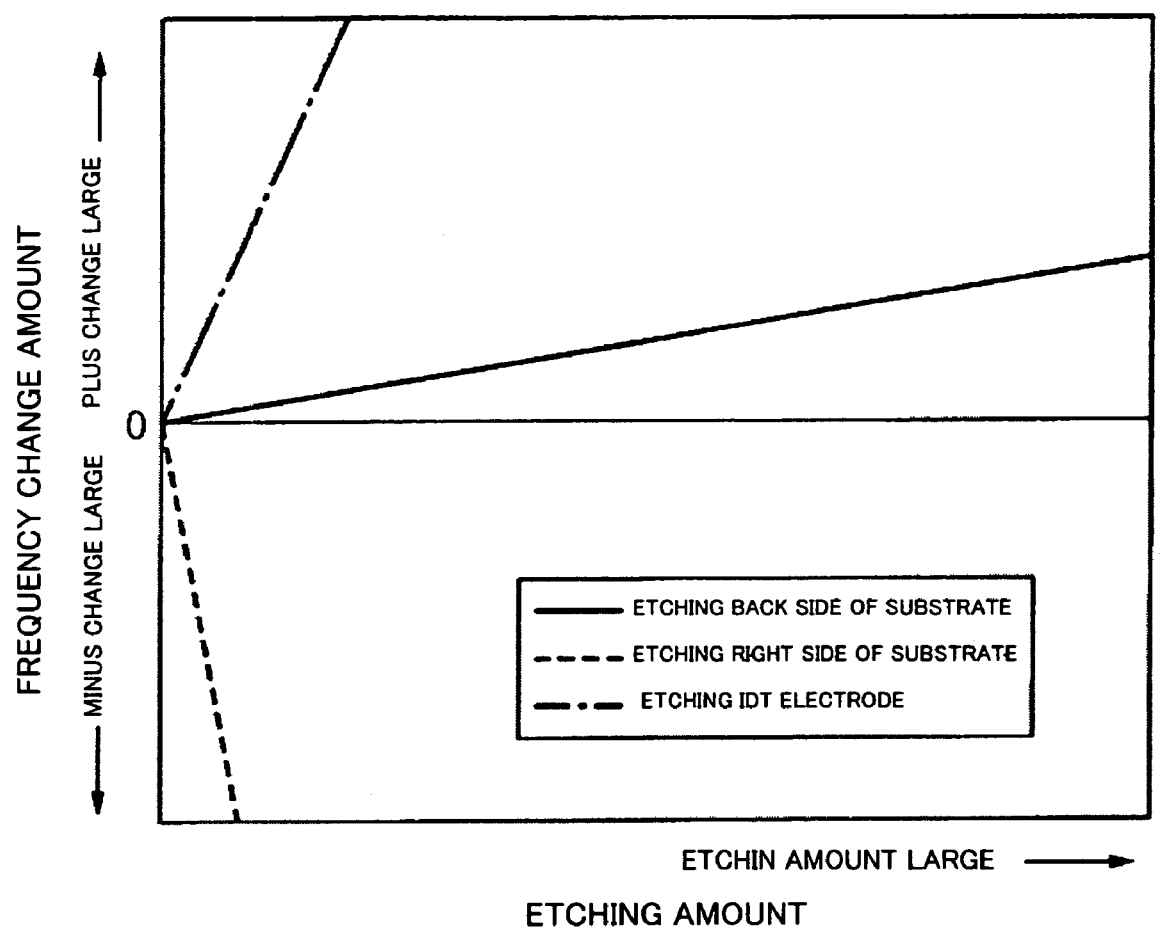

PLASMA

F I G. 11
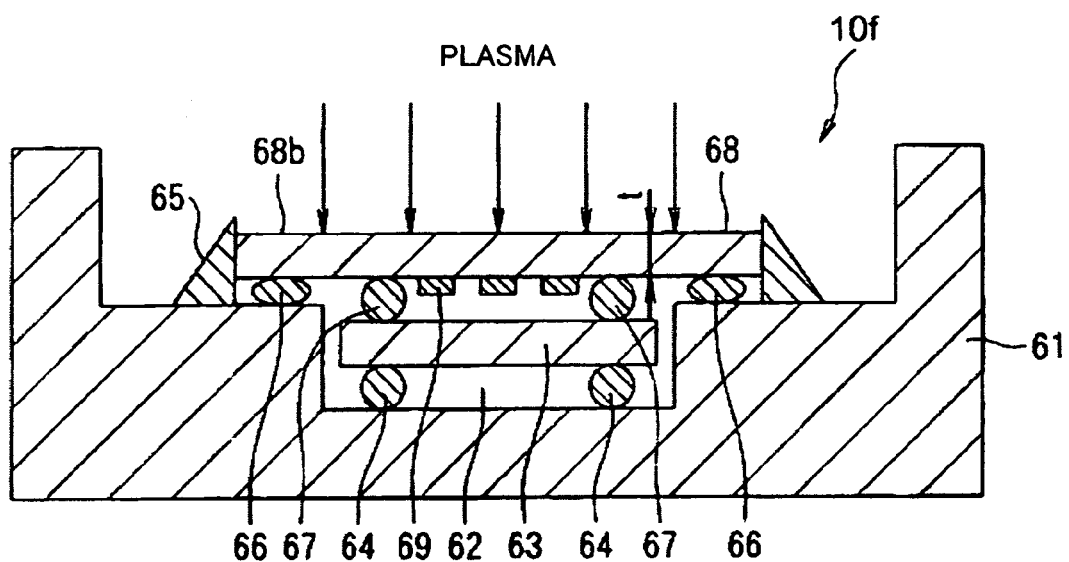
F I G. 12
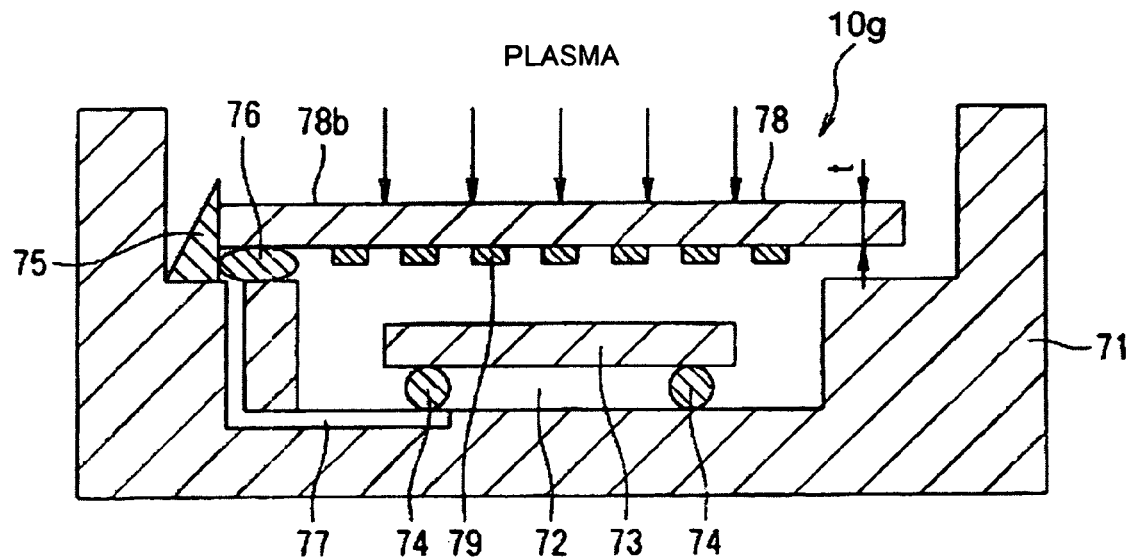

FREQUENCY ADJUSTMENT METHOD OF SURFACE ACOUSTIC WAVE DEVICE, SURFACE ACOUSTIC WAVE DEVICE, AND ELECTRONIC DEVICE

This application claims the benefit of Japanese Patent Application No. 2004-171164 filed on Jun. 9, 2004 and Japanese Patent Application No. 2005-031525 filed on Feb. 8, 2005. The entire disclosure of the prior applications are hereby incorporated by reference herein in their entirety.

BACKGROUND

The exemplary embodiments relate to a method for adjusting frequency for a surface acoustic wave device using a pseudo-longitudinal leaky surface acoustic wave, the surface acoustic wave device, and an electronic device having the surface acoustic wave device.

In the related art, the resonance frequency of a surface acoustic wave element depends on the effective film thickness of an interdigitated (IDT) electrode or a reflector electrode (hereinafter, "an IDT electrode or a reflector electrode" is referred to as an electrode). The frequency increases as the electrode film thickness becomes small while the frequency decreases as the electrode film thickness becomes large. The frequency of a surface acoustic wave device is adjusted in the related art by using this principle.

For example, the method to adjust the frequency by trimming an electrode to be thin is disclosed in a first example of the related art. The related art includes another frequency adjustment method (second example of the related art), wherein instead of thickening an electrode, the apparent electrode film thickness is increased by trimming a substrate using an electrode as a mask.

In recent years, as the usage of communication devices expands, higher frequency of surface acoustic wave devices and more accurate adjustments of frequency are desired. It is particularly expected that a pseudo-longitudinal leaky surface acoustic wave can be used for higher frequency of surface acoustic wave devices. This wave is expected to result from expansion according to the theory of leaky surface acoustic waves. Further, this wave has displacement, most of which is composed of longitudinal wave components, on the substrate surface, and propagates at a fast phase velocity while radiating two transverse wave components as volume waves inside a piezoelectric substrate. It is expected that particularly using lithium tantalite ($LiTaO_3$), lithium niobate ($LiNbO_3$), and lithium tetraborate ($Li_2B_4O_7$), which have high electromechanical coupling coefficients, as substrate materials will achieve a higher frequency of surface acoustic wave devices. See Japanese Unexamined Patent Publication No. Sho 62-274081 and Japanese Unexamined Patent Publication No. Sho 61-92011.

As described above, in related art frequency adjustments of surface acoustic waves, an electrode or a substrate surface on which the electrode is formed has been trimmed by a method, such as etching. However, the frequency change with respect to the etching amount is large, and therefore adjusting frequency with high accuracy is difficult. Particularly in the surface acoustic wave devices that use pseudo-longitudinal leaky surface acoustic waves to strive for higher frequency, the frequency change with respect to the etching amount is even larger, and therefore attaining a more accurate frequency adjustment is a problem for practical applications.

SUMMARY

Exemplary embodiments provide a method for adjusting frequency of a surface acoustic wave device that can adjust frequency with high accuracy in a surface acoustic wave device using a pseudo-longitudinal leaky surface acoustic wave. Exemplary embodiments also provide a surface acoustic wave device in which the frequency is adjusted with high accuracy by this frequency adjustment method, and provide an electronic device having the surface acoustic wave device.

Each aspect of the exemplary embodiments is structured as follows.

A first aspect of the exemplary embodiments provides a method for adjusting frequency of a surface acoustic wave device that includes a substrate including at least one of a lithium tantalate substrate, a lithium niobate substrate, and a lithium tetraborate substrate, the surface acoustic wave device further includes an IDT electrode formed on the substrate that excites a pseudo-longitudinal leaky surface acoustic wave. The method includes performing a frequency adjustment by adjusting a thickness of the lithium tantalate substrate, the lithium niobate substrate, or the lithium tetraborate substrate at a side opposite to, in a thickness direction, a side on which the IDT electrode is formed.

In the frequency adjustment by adjusting the thickness of a piezoelectric substrate at the side opposite in the thickness direction to the side on which the IDT electrode is formed, the frequency change with respect to etching amount is smaller than that in the frequency adjustment by adjusting an electrode of a piezoelectric substrate or the substrate surface on which the electrode is formed. Therefore, this method can perform a frequency adjustment with high accuracy.

In an exemplary embodiment, the frequency adjustment is performed by trimming with dry etching the side of the lithium tantalate substrate, the lithium niobate substrate, or the lithium tetraborate substrate opposite in a thickness direction to the side on which the IDT electrode is formed.

Thus, the substrate side opposite in the thickness direction to the side on which the electrode is formed can be trimmed by dry etching that can control a minute amount of etching in comparison to wet etching. As a result, a further, more accurate frequency adjustment can be performed.

In an exemplary embodiment, a preliminary frequency adjustment may be performed prior to the frequency adjustment by trimming at least either a surface of the right side of the lithium tantalate substrate, the lithium niobate substrate, or the lithium tetraborate substrate on which the IDT electrode is formed, or by trimming a surface of the IDT electrode.

Thus, when a large adjustment of frequency is needed, at least the surface of the side of the substrate on which an electrode is formed, or the electrode, is trimmed by wet etching, or the like, such that the frequency can be roughly adjusted (preliminary adjustment), and then the thickness of the substrate is adjusted at the opposite side to the side on which the electrode is formed by etching, or the like, such that the frequency can be adjusted with high accuracy (fine adjustment). The method can therefore adjust frequency in a short period of time in comparison to frequency adjustment by etching just the side opposite to the side on which the electrode is formed.

A second aspect of the exemplary embodiments provides a method for adjusting frequency of a surface acoustic wave device that includes disposing a surface acoustic wave device in a chamber into which etching gas is introduced. The surface acoustic wave device includes a lithium tantalate substrate, a lithium niobate substrate, or a lithium tetraborate substrate, and includes an IDT electrode formed thereon, exciting a pseudo-longitudinal leaky surface acoustic wave and has the substrate contained in a container. The method includes performing a frequency adjustment by etching a side of the substrate opposite to, in a thickness direction, the side on which the IDT electrode is formed while measuring input and output characteristics of the surface acoustic wave device until a desired frequency is obtained.

Thus, the method makes it possible to etch the opposite side of the piezoelectric substrate to the side on which the IDT electrode is formed after mounting the piezoelectric substrate with the formed IDT electrode on a package, and therefore can adjust the frequency of the surface acoustic wave device with high accuracy.

In this case, a preliminary frequency adjustment may be performed, prior to the frequency adjustment, by trimming at least either a surface of the right side of the lithium tantalate substrate, the lithium niobate substrate, or the lithium tetraborate substrate on which the IDT electrode is formed, or by trimming a surface of the IDT electrode.

Thus, when a large adjustment of frequency is needed, at least the surface of the substrate side on which an electrode is formed or the electrode is trimmed by wet etching such that the frequency can be roughly adjusted (preliminary adjustment). Then, the side opposite to the side on which the electrode is formed is etched such that the frequency can be adjusted with high accuracy (fine adjustment). The method can therefore adjust frequency in a short period of time in comparison to frequency adjustment by etching just the side opposite to the side on which the electrode is formed.

In an exemplary embodiment, a surface acoustic wave device has frequency that is adjusted by such a method for adjusting frequency as described above. Thus, a surface acoustic wave device that uses a pseudo-longitudinal leaky surface acoustic wave and has the frequency adjusted with high accuracy can be provided.

In an exemplary embodiment, an electronic device including a surface acoustic wave device as a filter, a resonator, or the like, has a surface acoustic wave device in which frequency is adjusted by such a method for adjusting frequency as described above. An electronic device having such a structure includes a surface acoustic wave device in which the frequency is adjusted with high accuracy, and can be provided as an electronic device with high performance.

BRIEF DESCRIPTION OF THE DRAWINGS

The exemplary embodiments will be described with reference to the accompanying drawings, wherein like numbers refer to like elements, and wherein:

FIGS. 1(a) and 1(b) are schematic structural views of a surface acoustic wave element according to one exemplary embodiment of the present invention;

FIG. 4 is a graph showing the relationship between the amount of etching and frequency change for frequency adjustment methods in an exemplary embodiment of the present invention;

FIG. 11 is a sectional schematic of another surface acoustic wave device to which a frequency adjustment method of the first exemplary embodiment of the present invention is applied;

FIG. 12 is a sectional schematic of another surface acoustic wave device to which a frequency adjustment method of the first exemplary embodiment of the present invention is applied.

DETAILED DESCRIPTION OF EMBODIMENTS

Exemplary embodiments of the invention will now be described with reference to the drawings.

First Exemplary Embodiment

FIG. 1(a) is a perspective view showing the schematic structure of a surface acoustic wave element according to the present embodiment, and FIG. 1(b) is a sectional view taken along the line A-A of FIG. 1(a).

A surface acoustic wave element 10a as a surface acoustic wave device has a piezoelectric substrate 1 including a lithium tantalate substrate, or a lithium niobate substrate or a lithium tetraborate substrate, and has an IDT electrode 2 and reflector electrodes 3a and 3b that are formed on the surface of the piezoelectric substrate 1.

In FIGS. 1(a) and 1(b), t is the thickness of the piezoelectric substrate 1, P is the pitch of the IDT electrode 2, λ is the IDT wavelength, and h is the thickness of the IDT electrode 2 and the reflector electrodes 3a and 3b. The piezoelectric substrate 1 is cut at the cutting angle corresponding to each piezoelectric material so that a pseudo-longitudinal leaky surface acoustic wave is excited, and the thickness t is adjusted to be a predetermined thickness.

The IDT electrode 2 and the reflector electrodes 3a and 3b are made of metal that has aluminum as a main component, and are formed on the piezoelectric substrate 1. The IDT electrode 2 has the function of exciting a pseudo-longitudinal leaky surface acoustic wave by supplying a driving voltage and outputting the vibration of predetermined frequency. The reflector electrodes 3a and 3b are formed so as to sandwich the IDT electrode 2 and have the function of reflecting the propagation of the pseudo-longitudinal leaky surface acoustic wave excited by the IDT electrode 2 toward the outside, such that the surface wave energy is confined to the IDT electrode 2.

Figure 2:
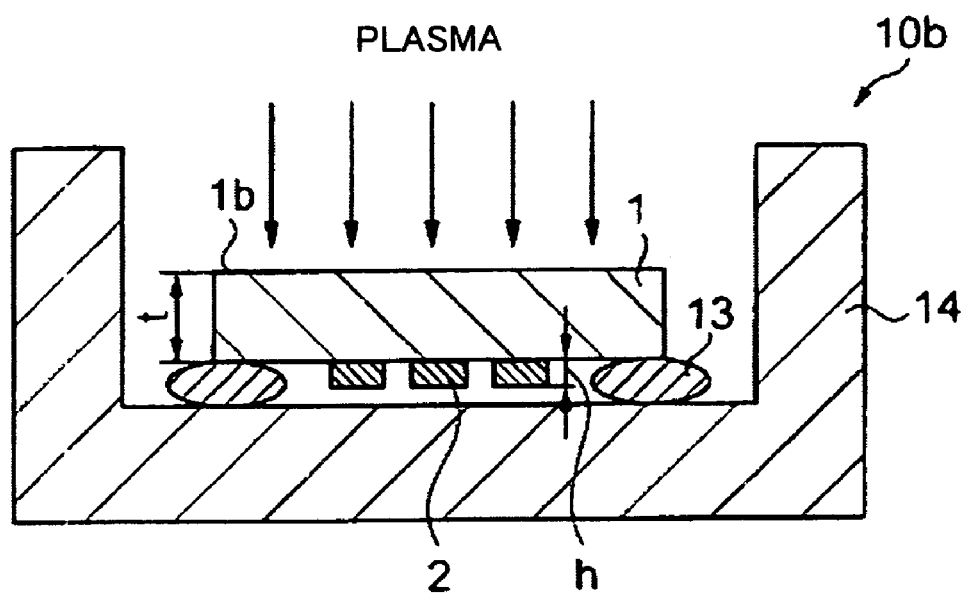
FIG. 2 is a sectional schematic of a surface acoustic wave device to which a frequency adjustment method of a first exemplary embodiment of the present invention is applied.

FIG. 2 is a schematic sectional view of a surface acoustic wave device including the above described surface acoustic wave element 10a contained in a container.

A surface acoustic wave device 10b includes a container 14 and the surface acoustic wave element 10a. The container 14, formed of ceramics or the like, has one open surface to form a concave. In the concave, the surface acoustic wave element 10a including the piezoelectric substrate 1 is mounted inside the container 14 holding a gold bump 13 therebetween so that the IDT electrode 2 faces downward. The electrical connection and the mechanical connection are thereby established simultaneously. In the surface acoustic wave device 10b, a surface 1b of the piezoelectric substrate 1 opposite to the surface on which the electrode 2 is formed is etched under this condition, whereby the thickness t of the piezoelectric substrate 1 is adjusted so that the target central frequency is achieved.

Figure 3:
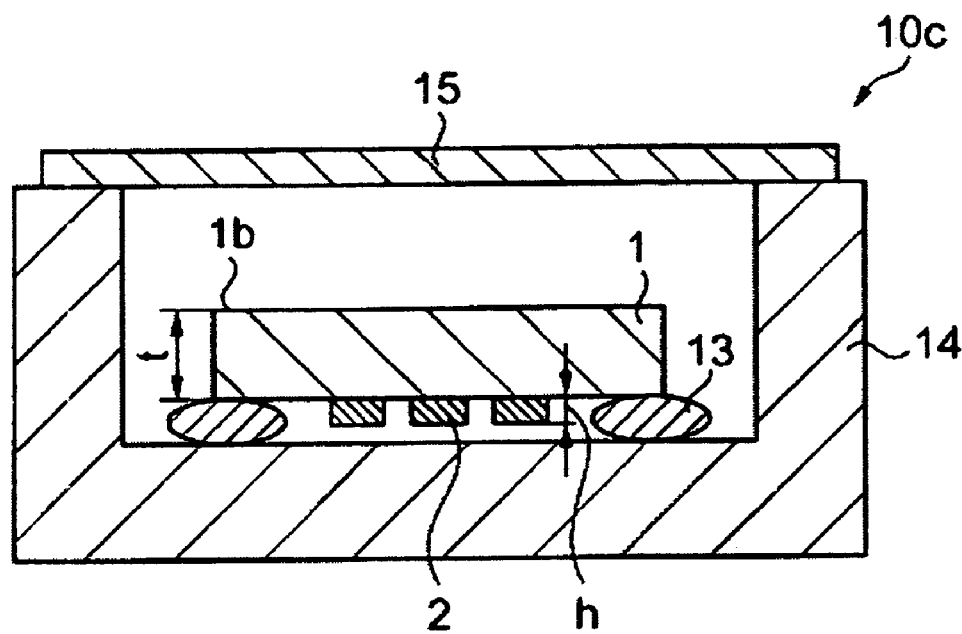
FIG. 3 is a sectional schematic of a packaged surface acoustic wave device in an exemplary embodiment of the present invention.

As shown in FIG. 3, a cover 15 is sealed on the top surface of the container 14 such that the inside of the container 14 is in a vacuum atmosphere or in an inert gas atmosphere, and thus a packaged surface acoustic wave device 10c is provided.

Prior to description of a frequency adjustment method of a surface acoustic wave device according to the present exemplary embodiment, the principle of frequency adjustment will be described.

In general, the frequency of a surface acoustic wave device depends on the effective film thickness of an IDT electrode or a reflector electrode (hereinafter, "an IDT electrode or a reflector electrode" is referred to as an electrode); the frequency increases as the electrode film thickness becomes small, while the frequency decreases as the electrode film thickness becomes large. By utilizing this principle, the method of etching an electrode for increasing the frequency and the method of trimming a substrate by using an electrode as a mask to increase the apparent electrode film thickness, instead of thickening an electrode, for decreasing the frequency, are practically employed to adjust the frequency of a surface acoustic wave element.

In the surface acoustic wave device using a pseudo-longitudinal leaky surface acoustic wave, since the pseudo-longitudinal leaky surface acoustic wave propagates while radiating energy in the direction of the depth (thickness) of an elastic body (piezoelectric body), adjustment of the substrate thickness enables the change of central frequency. In other words, the side opposite to, in a thickness direction, the side on which an electrode is formed, is etched to reduce the substrate thickness. As a result, the frequency can be increased.

FIG. 4 is a graph schematically illustrating the etching amount and frequency change of a surface acoustic wave device using a pseudo-longitudinal leaky surface acoustic wave in each frequency adjustment method.

When the surface of an electrode is etched to reduce the electrode film thickness, the frequency change is large with respect to the etching amount of the electrode and the frequency varies in the increasing direction, as shown by the alternate long and short dash line. When a piezoelectric substrate (the right side of a substrate) is etched using an electrode as a mask, the frequency change amount is large with respect to the etching amount of the piezoelectric substrate and the frequency varies in the decreasing direction as shown by the dashed line. In contrast to these cases, when the opposite side of the substrate (the back side of the substrate) to the side on which the electrode is formed is etched, the frequency change amount is small with respect to the etching amount of the piezoelectric substrate, and the frequency varies in the increasing direction as shown by the full line. This shows that etching the back side of the substrate is suitable for frequency adjustment with high accuracy, and particularly for frequency adjustment of a surface acoustic wave device having high frequency and short IDT wavelength.

Figure 5:
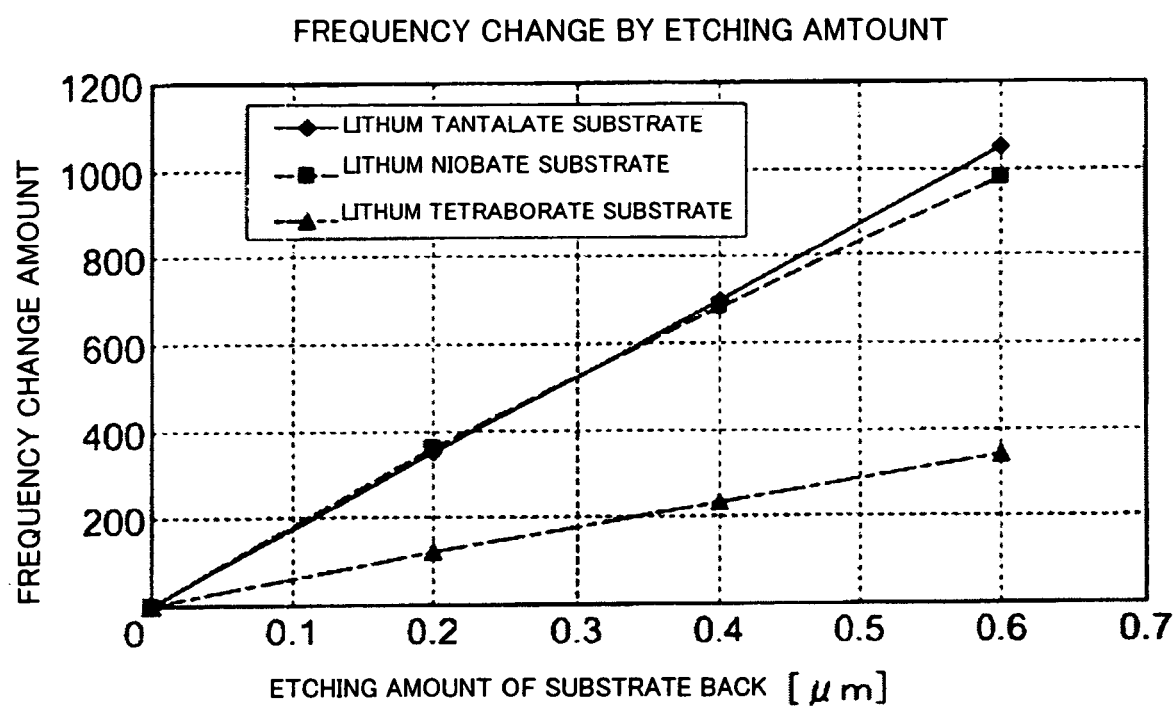
FIG. 5 is a graph showing the relationship between the amount of etching of a substrate and frequency change for substrate materials in an exemplary embodiment of the present invention.

FIG. 5 is a graph showing the relationship between the etching amount and the frequency change amount when a lithium tantalate substrate, a lithium niobate substrate, or a lithium tetraborate substrate is used as the piezoelectric substrate, and the opposite side of the substrate (the back side of the substrate) to the side on which an IDT electrode and reflector electrodes are formed is etched.

Thus, when each above described substrate material is used, the frequency change amount is small with respect to the etching amount and therefore frequency can be adjusted with high accuracy.

The frequency adjustment method of a surface acoustic wave device according to the exemplary embodiments of the invention enables frequency adjustment with high accuracy by etching the back side of the piezoelectric substrate.

The method of etching the back side of the piezoelectric substrate may be either wet etching or dry etching, but dry etching in which a minute amount of etching can be controlled is preferable.

Figure 6:
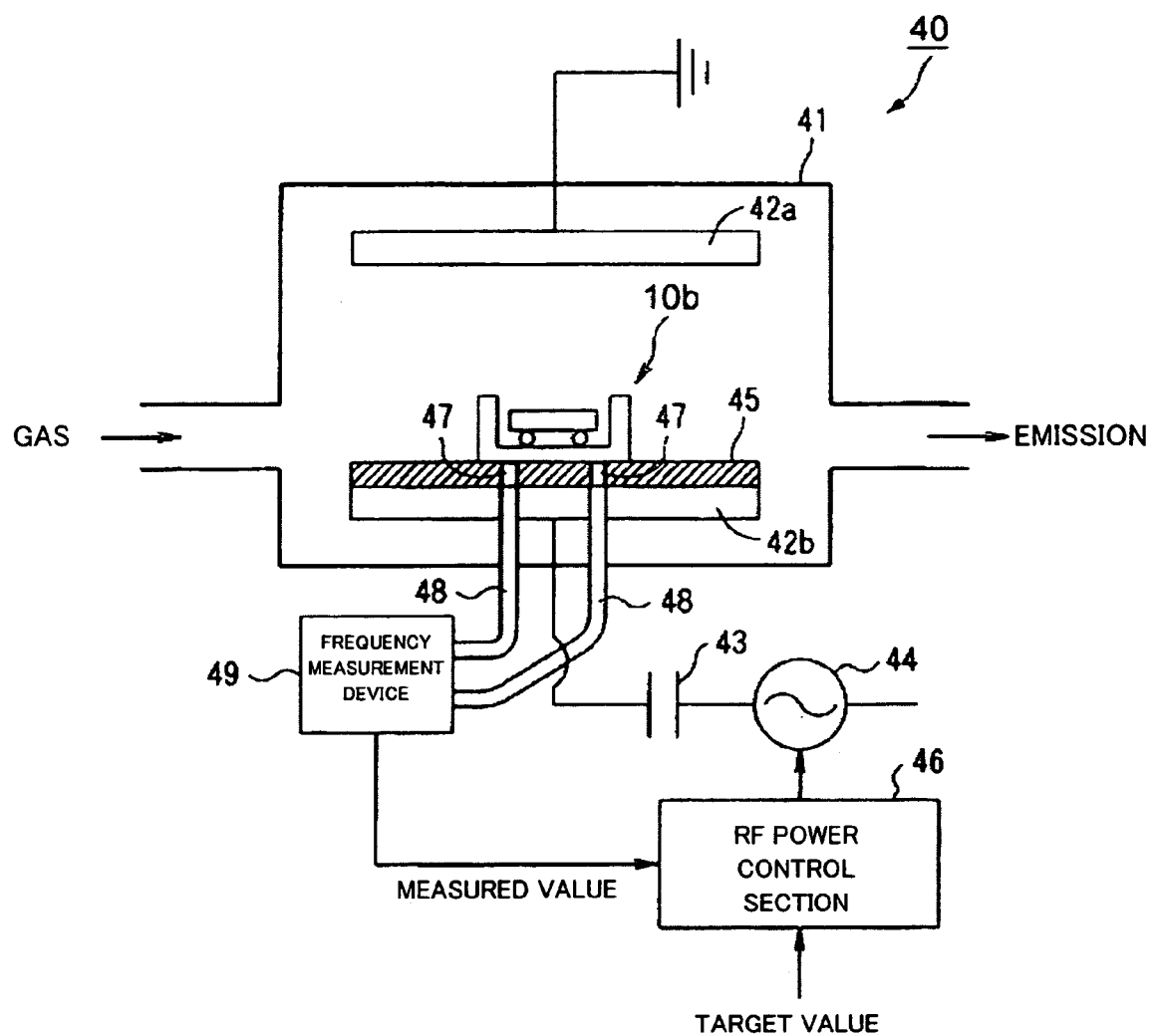
FIG. 6 is a schematic structural view of etching equipment in an exemplary embodiment of the present invention.

Etching equipment (frequency adjustment equipment) used in the embodiment will be described below. FIG. 6 is a schematic structural view of the etching equipment. Etching equipment 40 includes a chamber 41 and is structured such that gas can be introduced inside the chamber 41 and the air can be emitted from the chamber 41. In the chamber 41, an upper electrode 42a and a lower electrode 42b are located. The upper electrode 42a is grounded, and the lower electrode 42b is connected through a condenser 43 to a radio frequency (RF) power supply (a high frequency power supply) 44. On the lower electrode 42b, a support 45 is provided on which the surface acoustic wave device 10b with the surface acoustic wave element mounted inside the container can be placed.

Measurement terminals 47 for measuring the frequency of a pseudo-longitudinal leaky surface acoustic wave generated from the surface acoustic wave device 10b are set to the support 45. The measurement terminals 47 are connected through electric cables 48 to a frequency measurement device 49. The frequency measurement device 49 supplies the measured central frequency to an RF power control section 46. The RF power control section 46 compares the measured central frequency supplied with the target value to control an operation of the RF power supply 44 and the like.

The surface acoustic wave device 10b is placed on the support 45 for adjusting the frequency of it by using the etching equipment 40. As shown in FIG. 2, the surface acoustic wave device 10b is provided with the piezoelectric substrate 1 on a side (the back side 1b) opposing the side for forming the IDT electrode 2. Measurement of the central frequency of the surface acoustic wave device 10b then starts by the frequency measurement device 49. The chamber 41 introduces etching gas into the inside while exhausting the air in the inside, and plasma is generated under a predetermined reduced pressure.

At this moment, a high frequency voltage is applied between the upper electrode 42a and lower electrode 42b by the RF power supply 44, and therefore ions generated in plasma are accelerated in an electric field. The back side 1b of the piezoelectric substrate 1 is thereby etched. Thus the central frequency measured varies by this etching and approaches the target value. During this etching, the frequency measurement device 49 measures the central frequency of the surface acoustic wave device 10b and supplies the measured value to the RF power control section 46. The RF power control section 46 compares the measured value with the target value set in advance, and stops the operation of the RF power supply 44 if the measured value reaches the target value. Thus, the etching is stopped and the frequency adjustment ends.

Figure 7:
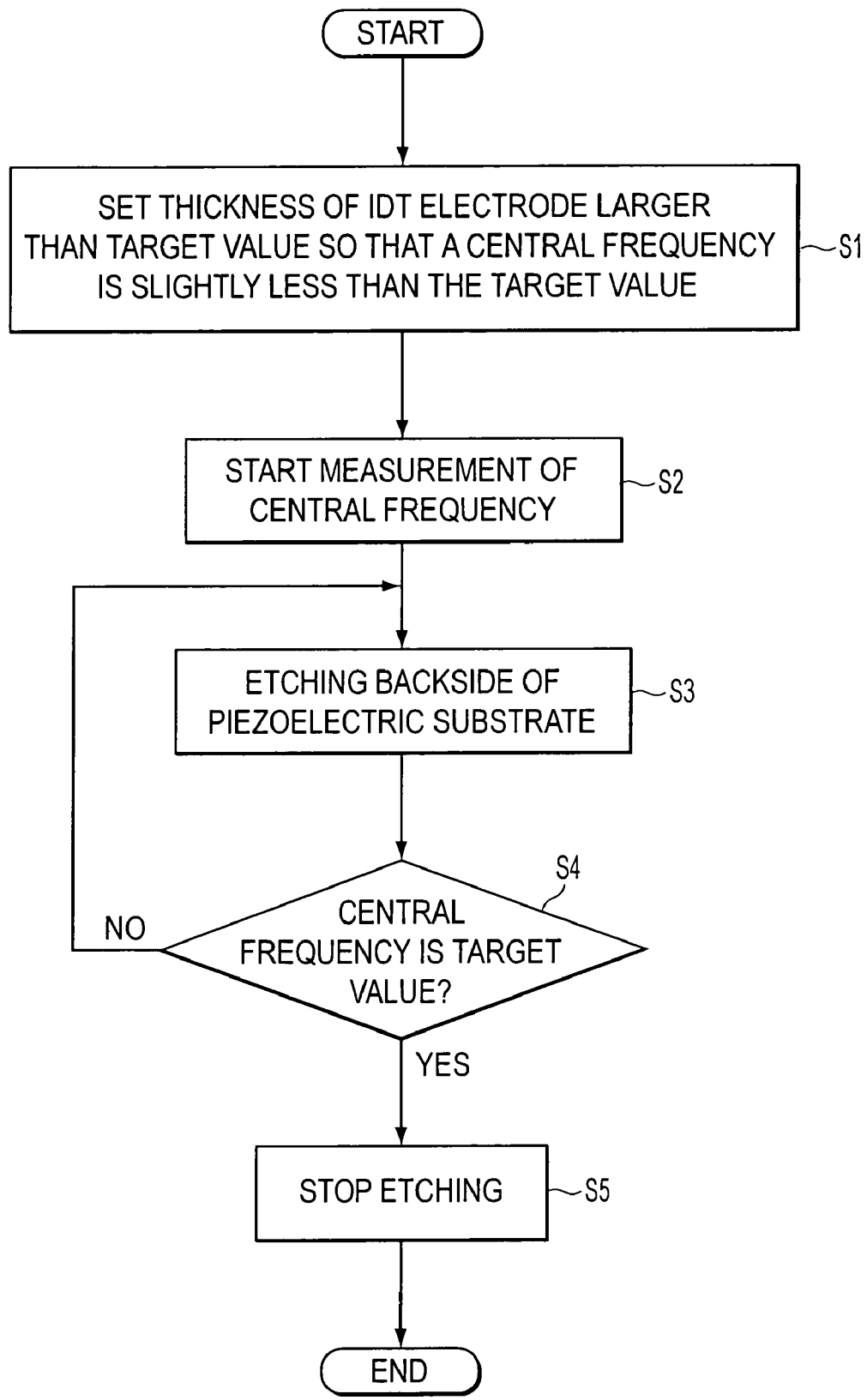
FIG. 7 is a flow chart indicating the procedures of a frequency adjustment method in an exemplary embodiment of the present invention.

A frequency adjustment method of a surface acoustic wave device by the use of the etching equipment 40 as described above will be described with reference to the flow chart in FIG. 7.

First, in step S1, the IDT electrode 2 formed on the piezoelectric substrate 1 is set to have the thickness h slightly larger than the target thickness such that the value of the central frequency is slightly less than the target value. The surface acoustic wave device 10b is then installed in the chamber 41 of the etching equipment 40, and a voltage is applied to the IDT electrode 2 to start measurement of the central frequency (input and output measurement) (step S2). The process proceeds to step S3, and the back side 1b of the piezoelectric substrate 1 is etched. By the etching, the central frequency measured gradually increases to approach the target value. In the next step S4, if the central frequency does not reach the target value, the process returns to step S3 to continue etching, whereas if the central frequency reaches the target value, the process proceeds to step S5 to stop etching. Namely, the method repeats the measurement of the central frequency while etching, and etching is continued until the central frequency reaches the target value.

According to the frequency adjustment method as described above, by etching the back side 1b of the piezoelectric substrate 1, that has little frequency change amount with respect to etching amount, the central frequency can be adjusted with high accuracy to the target value. Thus, frequency adjustment can be performed on the back side 1b of the piezoelectric substrate 1 by dry etching, and therefore the method can avoid frequency change after adjustment caused by residual aluminum, which becomes a problem when the right side of the piezoelectric substrate 1 is etched by plasma, or the like. The method can also adjust frequency without giving any damage to electrodes formed on the piezoelectric substrate 1. Therefore, a surface acoustic wave device that has little secular change of the central frequency and operates stably for a long time can be achieved.

Figure 8:
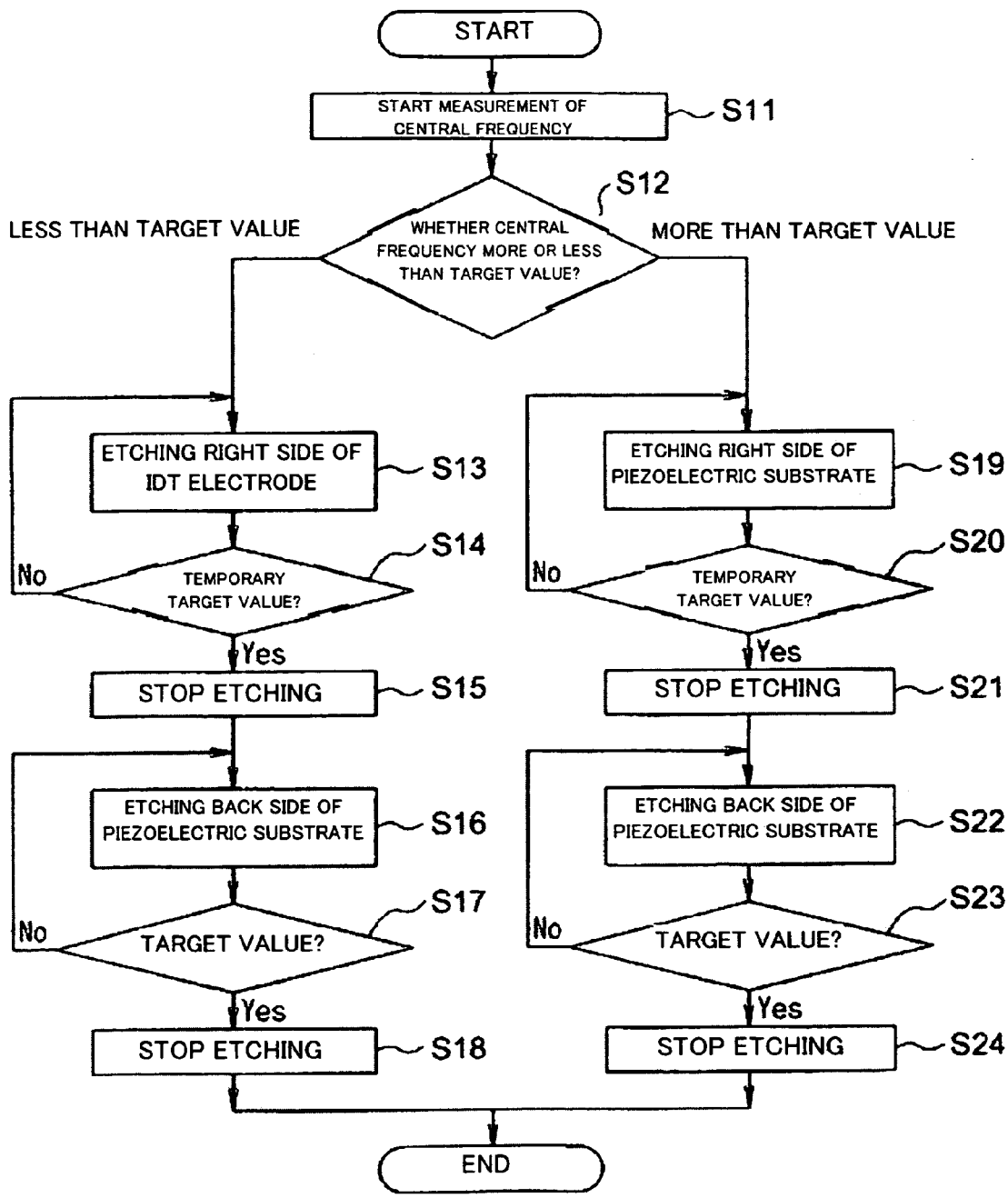
FIG. 8 is a flow chart indicating the procedures of a frequency adjustment method in an exemplary embodiment of the present invention.

Another frequency adjustment method will be described with reference to FIG. 8. This method is useful when frequency adjustment with high accuracy is needed because there are large variations in thickness of the IDT electrode formed on the piezoelectric substrate of the surface acoustic wave device and the like. First, a voltage is applied to the IDT electrode 2 to start measurement of the central frequency (step S11). Next, whether the value of the measured central frequency is more than the target value or less than the target value is decided (step S12).

As the result of this decision, if the value of the measured central frequency is less than the target value, the process proceeds to step S13, and if the value of the measured central frequency is more than the target value, the process proceeds to step S19. If the value of the measured central frequency is equal to the target value, the frequency adjustment is not necessary and the adjustment ends.

In step S13, the method etches the surface (right side) of the IDT electrode 2, for example, by wet etching while checking the measured frequency. The central frequency measured increases in a short period of time by the etching. The etching is continued until the measured central frequency reaches "a temporary target value" set to be slightly less than the target value of the central frequency (steps S13 and S14), and the etching stops when the measured central frequency reaches "the temporary target value" (step S15). The processes in steps S13 and S14 perform the rough adjustment of frequency (the preliminary frequency adjustment).

Next, the back side 1b of the piezoelectric substrate 1 is etched by the use of the etching equipment 40. The method performs the etching while checking the measured frequency (step S16). By the etching, the central frequency measured gradually increases to approach the target value. The etching is continued until the central frequency reaches the target value (steps S16 and S17), and the etching stops when the central frequency reaches the target value (step S18). The processes in steps S16 and S17 perform fine adjustment of frequency.

On the other hand, in step S19, the right side of the piezoelectric substrate 1 on which the IDT electrode is formed is etched, for example, by wet etching. The method performs the etching while checking the measured frequency. The central frequency measured decreases in a short period of time by the etching. The etching is continued until the measured central frequency reaches "a temporary target value" set to be slightly less than the target value of the central frequency (steps S19 and S20), and the etching stops when the measured central frequency reaches "the temporary target value" (step S21). The processes in steps S19 and S20 perform the rough adjustment of frequency (the preliminary frequency adjustment).

Next, the back side 1b of the piezoelectric substrate 1 is etched by the use of the etching equipment 40. The method performs the etching while checking the measured frequency (step S22). By the etching, the central frequency measured gradually increases to approach the target value. The etching is continued until the central frequency reaches the target value (steps S22 and S23), and the etching stops when the central frequency reaches the target value (step S24). The processes in steps S22 and S23 perform fine adjustment of frequency.

According to such a frequency adjustment method, even when there are variations in the target value of central frequency, the rough frequency adjustment in a short period of time by etching of the right side of the piezoelectric substrate 1 or the surface of the IDT electrode 2 and the subsequent fine frequency adjustment by etching of the back side 1b of the piezoelectric substrate 1 can achieve, on the whole, the frequency adjustment with high accuracy in a short period of time.

Particularly when the value of the central frequency before frequency adjustment is greater than the target value, etching of the back side 1b of the substrate cannot adjust the frequency because the etching increases the central frequency. In this case, the central frequency is reduced to the value less than the target value by etching of the right side of the piezoelectric substrate 1, and then the central frequency is increased by etching of the back side 1b of the substrate. The central frequency can thereby be adjusted to the target value. Thus, in the above described frequency adjustment method, the combination of etching of the right side of the piezoelectric substrate 1 and etching of the back side of the piezoelectric substrate 1 can adjust the central frequency even when its value before frequency adjustment is greater than the target value. As a result, the frequency adjustment method that produces high yield can be obtained.

Moreover, the rough frequency adjustment by wet etching of the surface of the IDT electrode 2 or the right side of the piezoelectric substrate 1 and the fine adjustment by dry etching of the back side 1b of the piezoelectric substrate 1 can be performed, and therefore the method can avoid frequency change after adjustment caused by residual aluminum, which becomes a problem when the right surface of the piezoelectric substrate 1 is etched by plasma, or the like. Accordingly, the method can adjust the frequency without giving any damage to electrodes formed on the piezoelectric substrate 1. Therefore, a surface acoustic wave device that has little secular change of the central frequency and operates stably for a long time can be achieved.

In the above example, the rough frequency adjustment is performed by etching of the right side of the piezoelectric substrate 1 (steps S19 and S20) or etching of the surface (right side) of the IDT electrode 2 (steps S13 and S14) and then the fine frequency adjustment is performed by etching of the back side 1b of the piezoelectric substrate 1. However, the following adjustment method may be employed.

If the central frequency is within the permissible range of "the temporary target value" as a result of frequency measurement in step S11, the process immediately shifts to etching of the back side of the piezoelectric substrate 1 (step S16 or step S22).

As necessary, the method may also adjust the central frequency to reach the target value by etching the surface (right side) of the IDT electrode 2 first, etching the right side of the piezoelectric substrate 1 secondly, and etching the back side 1b of the piezoelectric substrate 1 finally.

Although the frequency adjustment has been described under the condition where the surface acoustic wave element 10b is mounted on the container in the above embodiment, the frequency may be similarly adjusted under the condition of the surface acoustic wave element 10a shown in FIG. 1. In this case, the method may adjust the central frequency of the surface acoustic wave element 10a so as to have the target value, and then mount the surface acoustic wave element on the container and seal the container. Under the condition of the surface acoustic wave element 10a, the method may also perform rough frequency adjustment (preliminary frequency adjustment), and then mount the surface acoustic wave element on the container and perform fine frequency adjustment for the target value. (Embodiment of a surface acoustic wave device to which a frequency adjustment method of the embodiment of the invention is applied).

Figure 9:
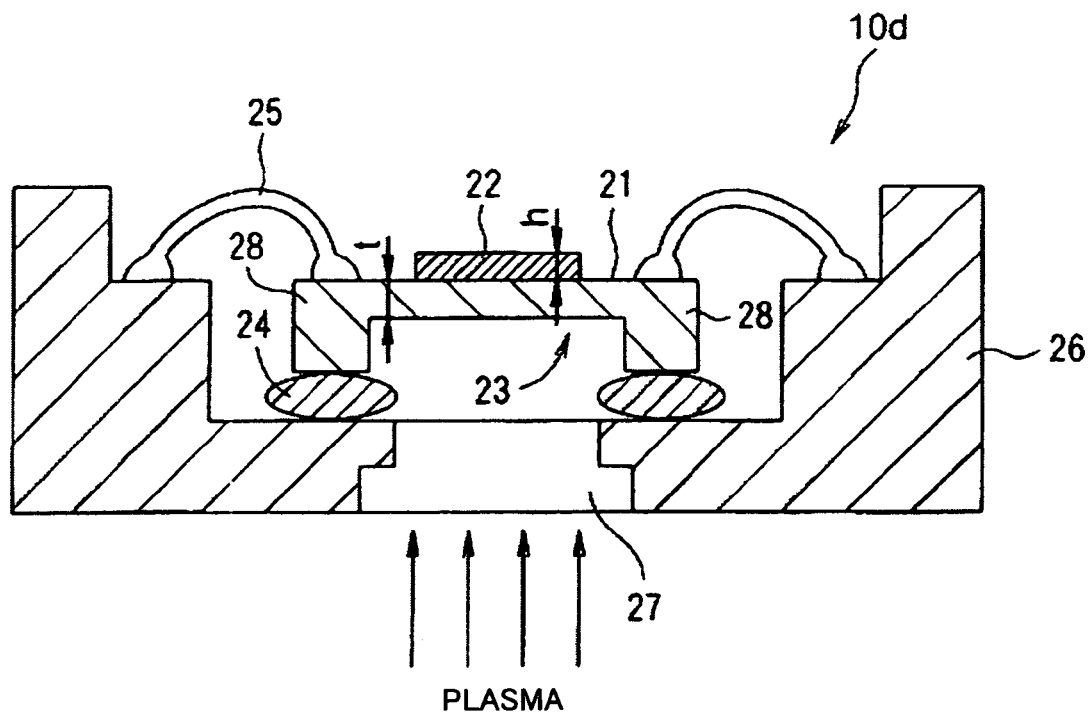
FIG. 9 is a sectional schematic of another surface acoustic wave device to which a frequency adjustment method of the first exemplary embodiment of the present invention is applied.

FIG. 9 is a sectional view of a surface acoustic wave device 10d to which a frequency adjustment method of the exemplary embodiments is applied.

In the surface acoustic wave device 10d, a piezoelectric substrate 21 on which an IDT electrode 22, and the like, are formed is glued into a container 26 made up of ceramics, or the like, with an adhesive 24 therebetween such that the IDT electrode 22 faces upward. The electrodes on the piezoelectric substrate 21 are connected through bonding wires 25 to an electrode of the container 26.

A reinforcement portion 28 is disposed along the outer periphery of the back side of the piezoelectric substrate 21. The reinforcement portion 28 forms a concave 23 at the back side of the piezoelectric substrate 21. The concave 23 is formed so as to correspond to at least the range in which the IDT electrode 22 on the piezoelectric substrate 21 is formed. The thickness t of the portion of the piezoelectric substrate 21 corresponding to the concave 23 is adjusted by etching so that the target central frequency is achieved.

For this frequency adjustment, an opening 27 is disposed at the bottom of the container 26 in correspondence to the concave 23 of the piezoelectric substrate 21. By etching the back side of the crystal substrate 21 through the opening 27 after bonding the piezoelectric substrate 21 into the container 26, the method can adjust the thickness t of the portion of the piezoelectric substrate 21 corresponding to the concave 23. After the frequency adjustment, the opening 27 is filled and also the container 26 is sealed.

The surface acoustic wave device 10d, as described above, can be mounted such that the side of the piezoelectric substrate 21 on which the IDT electrode 22 is formed faces up. Therefore, the circuit connection using wire bonding becomes possible and also the frequency can be adjusted with high accuracy to the target frequency.

Figure 10:
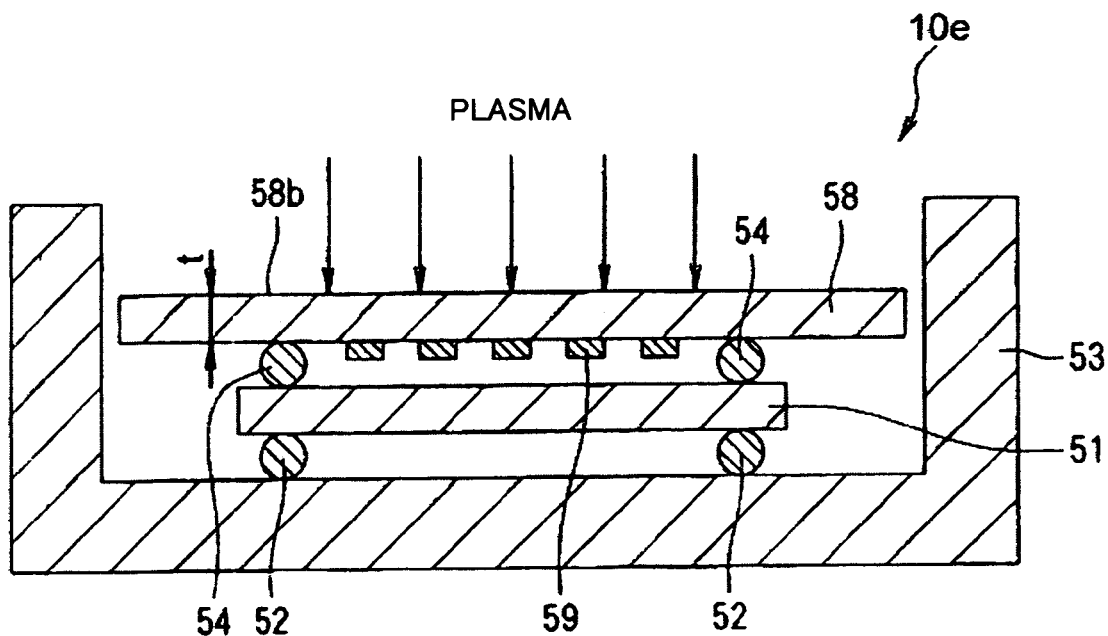
FIG. 10 is a sectional schematic of another surface acoustic wave device to which a frequency adjustment method of the first exemplary embodiment of the present invention is applied.

FIG. 10 is a sectional view of a surface acoustic wave device 10e to which a frequency adjustment method of the exemplary embodiments is applied.

In the surface acoustic wave device 10e, an IC chip 51 including a driving circuit and an amplifying circuit is connected to the bottom of a container 53 holding a gold bump 52 therebetween such that the electrical connection and the mechanical connection are simultaneously established. A piezoelectric substrate 58 with an IDT electrode 59 facing downward above the IC chip 51 is connected through a gold bump 54 to the IC chip 51 such that the IC chip 51 and the IDT electrode 59 are electrically connected with each other. Thus the IC chip 51 is covered with the piezoelectric substrate 58.

In the surface acoustic wave device 10e having such a structure as described above, the surface 58b opposite to the surface of the piezoelectric substrate 58 on which the electrode is formed is etched, and therefore the thickness t of the piezoelectric substrate 58 is adjusted so that the target central frequency is achieved. After adjustment of frequency, the ceramic package 53 is sealed.

In the surface acoustic wave device 10e, since the piezoelectric substrate 58 is disposed to cover the IC chip 51, the IC chip 51 is protected by the piezoelectric substrate 58 in plasma etching of frequency adjustment. Therefore, damage by plasma of the IC chip 51 can be reduced or prevented.

FIG. 11 is a sectional view of a surface acoustic wave device 10f to which a frequency adjustment method of the exemplary embodiments is applied.

In the surface acoustic wave device 10f, a concave 62 is provided at the bottom of a container 61. An IC chip 63 is contained in the concave 62 and connected to the bottom of the concave 62 holding a gold bump 64 therebetween, such that the electrical connection and the mechanical connection are simultaneously established.

A mount 65 is formed around the opening of the concave 62, and a piezoelectric substrate 68 is fitted to the portion surrounded by the mount 65 such that an IDT electrode 69 faces down. Under this condition, the piezoelectric substrate 68 is bonded to the periphery of the opening of the concave 62 by a sealing material 66 and is also connected to the IC chip 63 holding a gold bump 67 therebetween. Accordingly, the IC chip 63 is contained in the concave 62 and also the concave 62 is sealed.

In the surface acoustic wave device 10f having such a structure as described above, an opposite side 68b of the piezoelectric substrate 68 to the side on which the electrode is formed is etched, and therefore the thickness t of the piezoelectric substrate 68 is adjusted so that the target central frequency is achieved. After adjustment of frequency, the container 61 is sealed.

In the surface acoustic wave device 10*f*, since the IC chip 63 is sealed in the concave 62, the IC chip 63 is protected by the piezoelectric substrate 68 in plasma etching of frequency adjustment. Therefore, damage by plasma of the IC chip 63 can be reduced or prevented.

FIG. 12 is a sectional view of a surface acoustic wave device 10*g* to which a frequency adjustment method of the exemplary embodiments is applied. In the surface acoustic wave device 10*g*, a concave 72 is provided at the bottom of a container 71. An IC chip 73 is contained in the concave 72 and connected to the bottom of the concave 72 holding a gold bump 74 therebetween such that the electrical connection and the mechanical connection are simultaneously established.

A mount 75 is formed in part of the portion around the opening of the concave 72 (in this example, at one side of the portion around the opening), and at least one side of a piezoelectric substrate 78 is supported by the mount 75 such that an IDT electrode 79 faces downward. Under this condition, at least one side of the piezoelectric substrate 78 is bonded and fixed to the periphery of the opening of the concave 72 by a conductive adhesive 76. Moreover, the piezoelectric substrate 78 and the IC chip 73 are electrically connected through through-hole 77 disposed in the container 71.

Accordingly, the concave 72 is filled with the piezoelectric substrate 78, and therefore the IC chip 73 in the concave 72 is covered with the piezoelectric substrate 78.

In the surface acoustic wave device 10*g* having such a structure as described above, an opposite surface 78*b* of the piezoelectric substrate 78 to the surface on which an electrode is formed is etched, and therefore the thickness t of the piezoelectric substrate 78 is adjusted so that the target central frequency is achieved. After adjustment of frequency, the container 71 is sealed.

In the surface acoustic wave device 10*g*, since the piezoelectric substrate 78 is disposed to cover the IC chip 73, the IC chip 73 is protected by the piezoelectric substrate 78 in the above described plasma etching. Therefore the IC chip 73 can be prevented from the damage by plasma.

Second Exemplary Embodiment

A surface acoustic wave device according to a second exemplary embodiment will be described.

The surface acoustic wave device according to this embodiment is adjusted by a frequency adjustment method as described above, as shown in FIGS. 1A and 1B, FIG. 3, and FIGS. 9 to 12. This surface acoustic wave device can be provided as a surface acoustic wave device that uses a pseudo-longitudinal leaky surface acoustic wave and has the frequency adjusted with high accuracy.

Third Exemplary Embodiment

An electronic device according to a third exemplary embodiment will be described.

Figure 13:
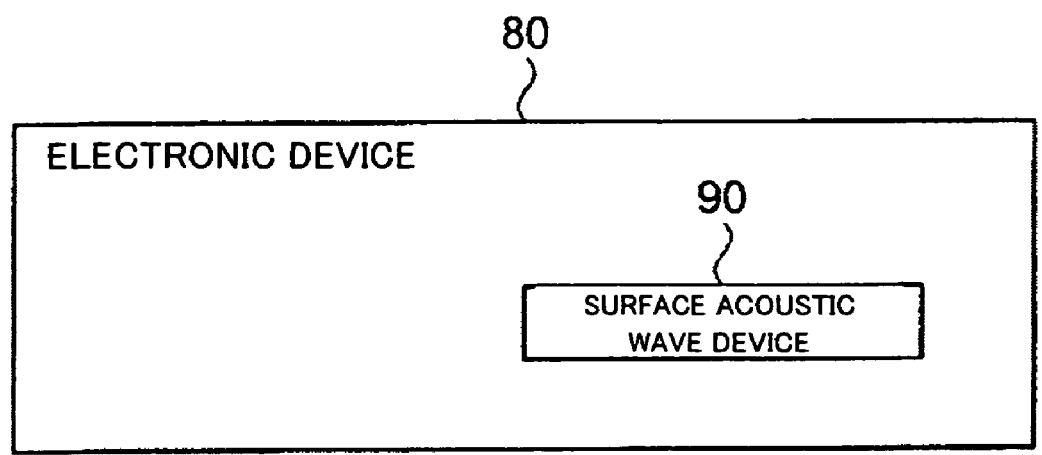
FIG. 13 is a structure schematic of an electronic device in an exemplary embodiment of the present invention.

FIG. 13 is a structure view of an electronic device of the present embodiment. An electronic device 80 includes a surface acoustic wave device 90 adjusted by a frequency adjustment method as described above. Examples of electronic devices according to this embodiment include, for example, a cellular phone and a keyless entry system.

In the case of a cellular phone, such surface acoustic wave devices, as shown in FIGS. 1A and 1B, FIG. 3, and FIG. 9 are used as frequency selection filters. In the case of keyless entry system, the surface acoustic wave devices are used as resonators of oscillators, as shown in FIGS. 10 to 12.

Thus, an electronic device of this exemplary embodiment includes a surface acoustic wave device using a pseudo-longitudinal leaky surface acoustic wave as a filter, a resonator, or an oscillator.

An electronic device having such a structure includes a surface acoustic wave device in which the frequency is adjusted with high accuracy, and can be provided as an electronic device with high performance.

What is claimed is:

1. A method for adjusting frequency of a surface acoustic wave device that includes a substrate including at least one of a lithium tantalate substrate, or a lithium niobate substrate or a lithium tetraborate substrate, the surface acoustic wave device further including an IDT electrode formed on the substrate that excites a pseudo-longitudinal leaky surface acoustic wave, the method comprising:

performing a frequency adjustment by adjusting a thickness of the substrate at a side opposite to, in a thickness direction, a side on which the IDT electrode is formed.

2. The method for adjusting frequency of a surface acoustic wave device according to claim 1, the performing including performing frequency adjustment by trimming with dry etching the side of the lithium tantalate substrate, the lithium niobate substrate, or the lithium tetraborate substrate opposite to, in the thickness direction, the side on which the IDT electrode is formed.

3. The method for adjusting the frequency of a surface acoustic wave device according to claim 1, further comprising:

performing a preliminary frequency adjustment prior to the frequency adjustment by trimming at least a surface of the right side of the lithium tantalate substrate, the lithium niobate substrate, or the lithium tetraborate substrate on which the IDT electrode is formed, or by trimming a surface of the IDT electrode.

4. A method for adjusting a frequency of a surface acoustic wave device, the method comprising:

disposing a surface acoustic wave device in a chamber into which etching gas is introduced, the surface acoustic wave device including a substrate including at least one of a lithium tantalate substrate, or a lithium niobate substrate or a lithium tetraborate substrate, the surface acoustic wave device further including an IDT electrode formed on the substrate that excites a pseudo-longitudinal leaky surface acoustic wave, the surface acoustic wave device having the substrate contained in a container; and performing a frequency adjustment by etching a side of the substrate opposite to, in thickness direction, a side on which the IDT electrode is formed while measuring input and output characteristics of the surface acoustic wave device until a desired frequency is obtained.

5. The method for adjusting the frequency of a surface acoustic wave device according to claim 4, further comprising:

performing a preliminary frequency adjustment prior to the frequency adjustment by trimming at least a surface of a right side of the substrate on which the IDT electrode is formed, or by trimming of a surface of the IDT electrode.

6. A surface acoustic wave device, comprising:
a substrate including at least one of a lithium tantalate substrate, a lithium niobate substrate, and a lithium tetraborate substrate; and
an IDT electrode formed on the substrate that excites a psuedo-longitudinal leaky surface acoustic wave, frequency of the surface acoustic wave device being adjusted by the method for adjusting frequency according to claim 1.

7. An electronic device, comprising:
a substrate including at least one of a surface acoustic wave device usable as a filter;
a resonator; and
a surface acoustic wave device, frequency of the surface acoustic wave device being adjusted by the method for adjusting frequency according to claim 1.

* * * * *